US008036023B2

(12) United States Patent
Lawrence et al.

(10) Patent No.: US 8,036,023 B2
(45) Date of Patent: Oct. 11, 2011

(54) SINGLE-EVENT UPSET IMMUNE STATIC RANDOM ACCESS MEMORY CELL CIRCUIT

(75) Inventors: Reed K. Lawrence, Purcellville, VA (US); Nadim F. Haddad, Oakton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 12/899,802

(22) Filed: Oct. 7, 2010

(65) Prior Publication Data

US 2011/0026315 A1   Feb. 3, 2011

Related U.S. Application Data

(62) Division of application No. 12/141,900, filed on Jun. 18, 2008, now Pat. No. 7,876,602.

(60) Provisional application No. 60/936,023, filed on Jun. 18, 2007.

(51) Int. Cl.
 *G11C 11/00* (2006.01)
(52) U.S. Cl. ......................... 365/156; 365/154
(58) Field of Classification Search .................... 365/156
 See application file for complete search history.

(56) References Cited

U.S. PATENT DOCUMENTS

| 4,532,609 | A | 7/1985 | Iizuka |
| 4,797,804 | A | 1/1989 | Rockett, Jr. |
| 4,956,814 | A | 9/1990 | Houston |
| 4,956,815 | A | 9/1990 | Houston |
| 5,095,355 | A | 3/1992 | Shiomi et al. |
| 5,157,625 | A * | 10/1992 | Barry ........................... 365/154 |
| 5,301,146 | A | 4/1994 | Hama |
| 5,307,142 | A | 4/1994 | Corbett et al. |
| 5,406,513 | A | 4/1995 | Canaris et al. |
| 6,058,041 | A | 5/2000 | Golke et al. |
| 6,208,554 | B1 | 3/2001 | Phan et al. |
| 6,215,694 | B1 | 4/2001 | Li et al. |
| 6,327,176 | B1 | 12/2001 | Li et al. |
| 6,487,134 | B2 | 11/2002 | Thoma et al. |
| 6,573,773 | B2 * | 6/2003 | Maki et al. .................... 327/200 |
| 6,627,960 | B2 | 9/2003 | Nii et al. |

(Continued)

FOREIGN PATENT DOCUMENTS

JP   2005-116164   4/2005

(Continued)

*Primary Examiner* — Son Mai
(74) *Attorney, Agent, or Firm* — Graybeal Jackson Haley; Daniel J. Long (57) ABSTRACT

A circuit and method are provided in which a six-transistor (6-T) SRAM memory cell is hardened to single-event upsets by adding isolation-field effect transistors ("iso-fets") connected between the reference voltage Vdd and the field-effect transistors ("fets") respectively corresponding to first and second inverters of the memory cell. According to certain embodiments, the control gates of first and second P-iso-fets are respectively tied to the control gates of first and second pull-up P-fets. According to certain embodiments, first and second N-iso-fets are connected between the output nodes of the memory cell and the pull-down N-fets respectively corresponding to the first and second inverters. The control gates of the first and second N-iso-fets are respectively tied to the control gates of the first and second pull-down N-fets. Again according to certain embodiments, one or more of the iso-fets are physically removed from the proximity of other transistors which comprise the memory cell.

2 Claims, 12 Drawing Sheets

U.S. PATENT DOCUMENTS

| | | |
|---|---|---|
| 6,703,858 B2 | 3/2004 | Knowles |
| 6,744,661 B1 | 6/2004 | Shubat |
| 6,774,667 B1 | 8/2004 | Chan |
| 6,807,081 B2 * | 10/2004 | Nii .................. 365/145 |
| 6,914,804 B2 | 7/2005 | Lesea |
| 6,992,916 B2 | 1/2006 | Liaw |
| 7,200,031 B2 | 4/2007 | Liu et al. |
| 7,332,780 B2 * | 2/2008 | Matsuda et al. .............. 257/369 |
| 2001/0025963 A1 | 10/2001 | Tashiro et al. |
| 2004/0037127 A1 | 2/2004 | Lindhorst et al. |
| 2008/0144421 A1 | 6/2008 | Deng et al. |

FOREIGN PATENT DOCUMENTS

| | | |
|---|---|---|
| WO | 9963542 | 12/1999 |

* cited by examiner

SINGLE-EVENT UPSET IMMUNE STATIC RANDOM ACCESS MEMORY CELL CIRCUIT

PRIORITY CLAIM

This application is a divisional application of U.S. Ser. No. 12/141,900 filed Jun. 18, 2008 which claims priority from provisional patent application No. 60/936,023, filed Jun. 18, 2007, which is incorporated herein by reference.

STATEMENT OF GOVERNMENT INTEREST

The invention was made with United States Government support under Contract No. DTRA 01-03-D-0007-0001 awarded by the Defense Threat Reduction Agency. The United States Government has certain rights in this invention.

TECHNICAL FIELD

The present invention relates generally to integrated circuits, and more specifically to integrated circuits that operate in environments where radiation-induced logic errors may occur.

BACKGROUND

Integrated circuits are operated in environments where radiation-induced logic errors may occur, such as in outer space. In such environments, the integrated circuit is required to maintain data integrity during a single-event upset (SEU). A single-event upset is a radiation-induced error in the logic state of a signal within the integrated circuit. Such a single-event upset may be the result of a collision between a high-energy proton or a heavy ion (cosmic ray) and the semiconductor material that forms the integrated circuit. The interaction of these charged particles, or heavy ions, with metal oxide semiconductor (MOS) static random access memory (SRAM) cells results in low linear energy transfer (LET) from the charged particle to the SRAM cells.

The basic operation of the SRAM cell is to store electronic information in the form of 1's and 0's. In space-based electronics, where cosmic-rays exist and bombard electronics continuously, LET from a heavy ion's interaction with an SRAM cell can flip/change the state of that cell's stored information from a 0 to a 1 (or a 1 to a 0). This interaction corrupts stored information and can lead to incorrect operation of associated circuitry. To prevent single-event upsets from causing erroneous operation of an integrated circuit containing SRAM cells, circuitry within the integrated circuit must be designed to withstand such upsets.

Figure 1:
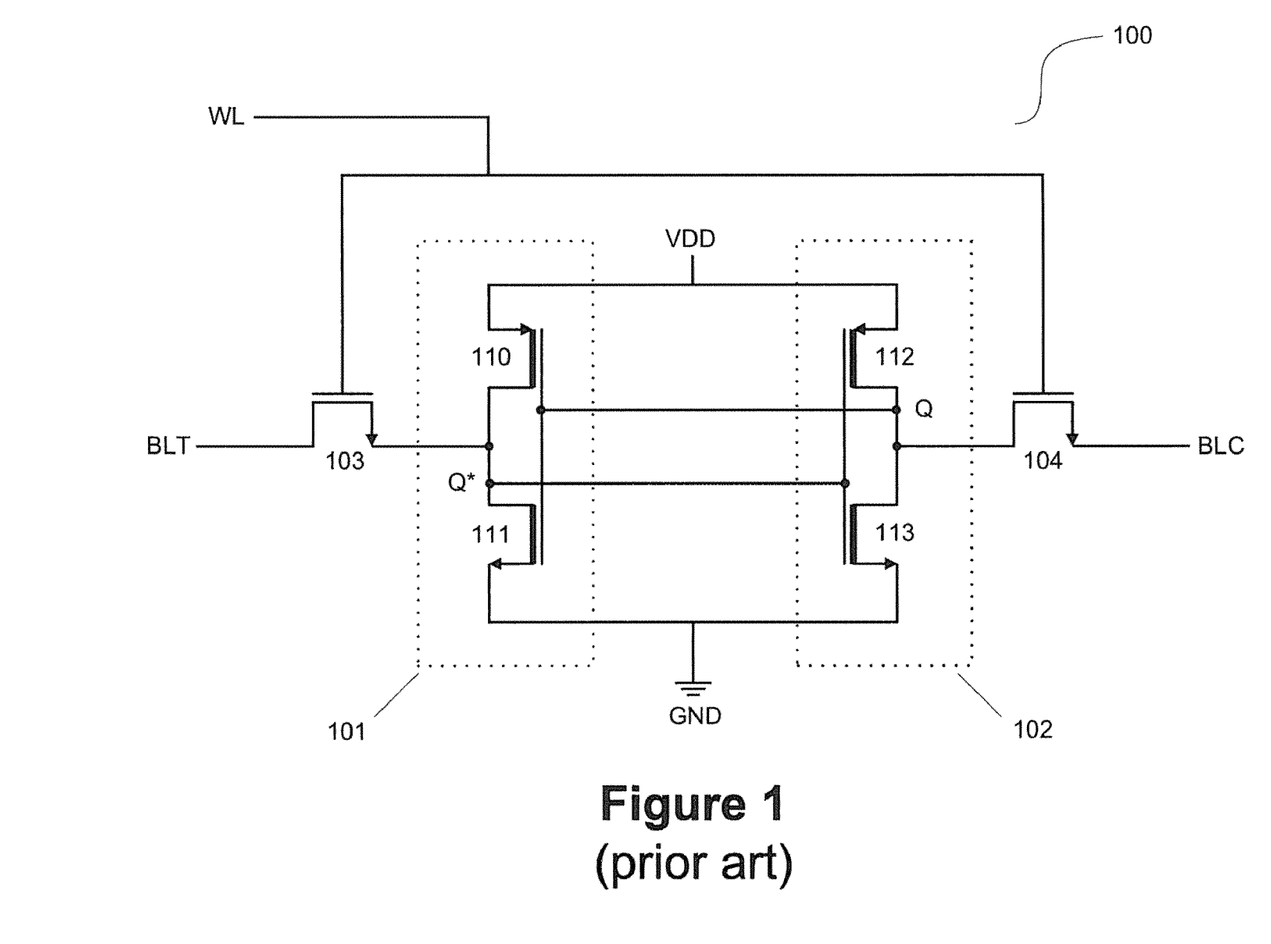
FIG. 1 is a schematic drawing showing a conventional 6-transistor MOS SRAM memory cell.

A simple six-transistor SRAM cell is shown in FIG. 1. A bit in the SRAM cell 100 is stored through four transistors 110-113 that together form two cross-coupled inverters 101 and 102 disposed between reference voltages VDD and GND. Inverter 101 comprises P-type field-effect-transistor ("P-fet") 110 and N-type field-effect-transistor ("N-fet") 111 while inverter 102 comprises P-fet 112 and N-fet 113. The control gates of transistors 110 and 111 are commonly connected at first output node Q and the control gates of transistors 112 and 113 are commonly connected at second output node Qbar. The storage cell 100 has two stable states which are respectively used to denote a logical 0 and a logical 1.

Two additional access transistors 103 and 104 serve to control the access to data stored on the output nodes Q, Qbar during read and write operations. Upon charging of a word line WL coupled to the gates of these access transistors 103 and 104, the access transistors turn ON and transfer data stored on the output nodes Q, Qbar onto the bitlines BLT and BLC.

In operation, to access data stored in the SRAM cell 100 the wordline WL is activated to turn ON the access transistors 103 and 104. The cell 100 thereafter transfers the data stored in the cell in the form of the voltages on the output nodes Q, Qbar onto the bitlines BLT, BLC during a read operation. During a write operation, voltages are applied on the bitlines BLT, BLC corresponding to the data to the stored in the cell 100 to thereby drive the voltages on the nodes Q, Qbar to the desired voltages. In the SRAM cell 100, even when turned OFF the transistor may be in saturation with Vdd applied across its source and drain, which increases the LET-sensitivity of the memory cell, and concomitantly increases the likelihood of a single-event upset causing an error flipping the state of the cell, as described in further detail with respect to FIGS. 2A-2C below.

To examine the scenario resulting from an SEU impact of SRAM memory cell 100, assume that the bit stored in cell 100 is a logical 1, meaning output node Q is at approximately Vdd and output node Qbar at approximately ground. N-fet 113 and P-fet 110 are consequently both off, while N-fet 111 is ON and "pulling down" node Qbar just as P-fet 112 is "pulling up" output node Q. Although N-fet 113 is off, it is in saturation mode due to the voltage across its drain coupled to node Q and its source connected to ground. Similarly, P-fet 110 is off but also in saturation mode since a voltage of approximately Vdd is across its source and drain.

Figure 2A:
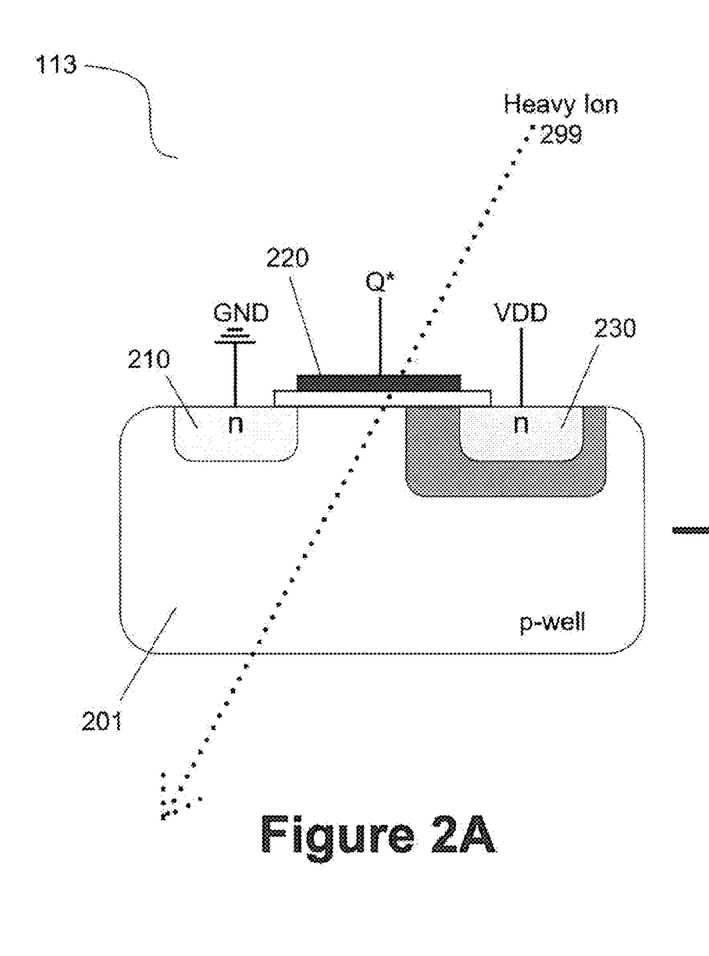
FIGS. 2A-2B show respective cross-sectional views of a transistor within the conventional memory cell of FIG. 1.
Figure 2B:
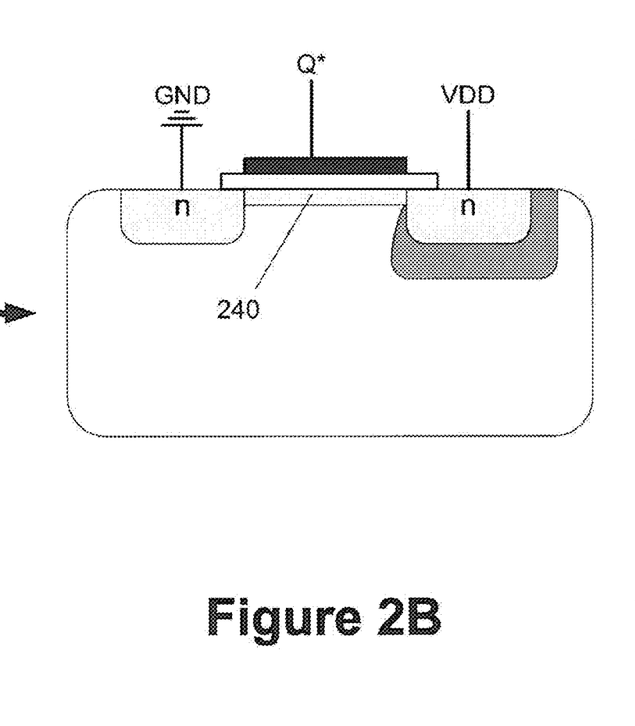

FIG. 2A shows a cross-section of N-type transistor 113 from FIG. 1 while off but in saturation mode, such as when memory cell 100 stores a logical 1. Transistor 113 is disposed in a substrate 201. Source 210 is connected to GND. Gate 220 is tied to Qbar, which is also in its low-voltage state (equivalent to GND) because memory cell 100 is storing a logical 1. Similarly, drain 230 is connected to Vdd by Q being in its high-voltage state. FIG. 2A also shows a single-event upset in the form of an impact from heavy ion 299, which results in additional charge via linear energy transfer (LET) in the area of substrate 210 between source 210 and drain 230. FIG. 2B shows this additional ion-charge deposition allowing a conduction channel 240 to form between source 210 and drain 230. This interaction turns transistor 1130N, driving node Q to a low-voltage state which, in turn, drives node Qbar high thus changes or flips the state of the memory cell 100. This causes a "soft error" of the data stored in the memory cell 100. A soft error is one which results the change of data stored in an SRAM memory cell but which does not damage the circuitry of the cell.

Figure 3:
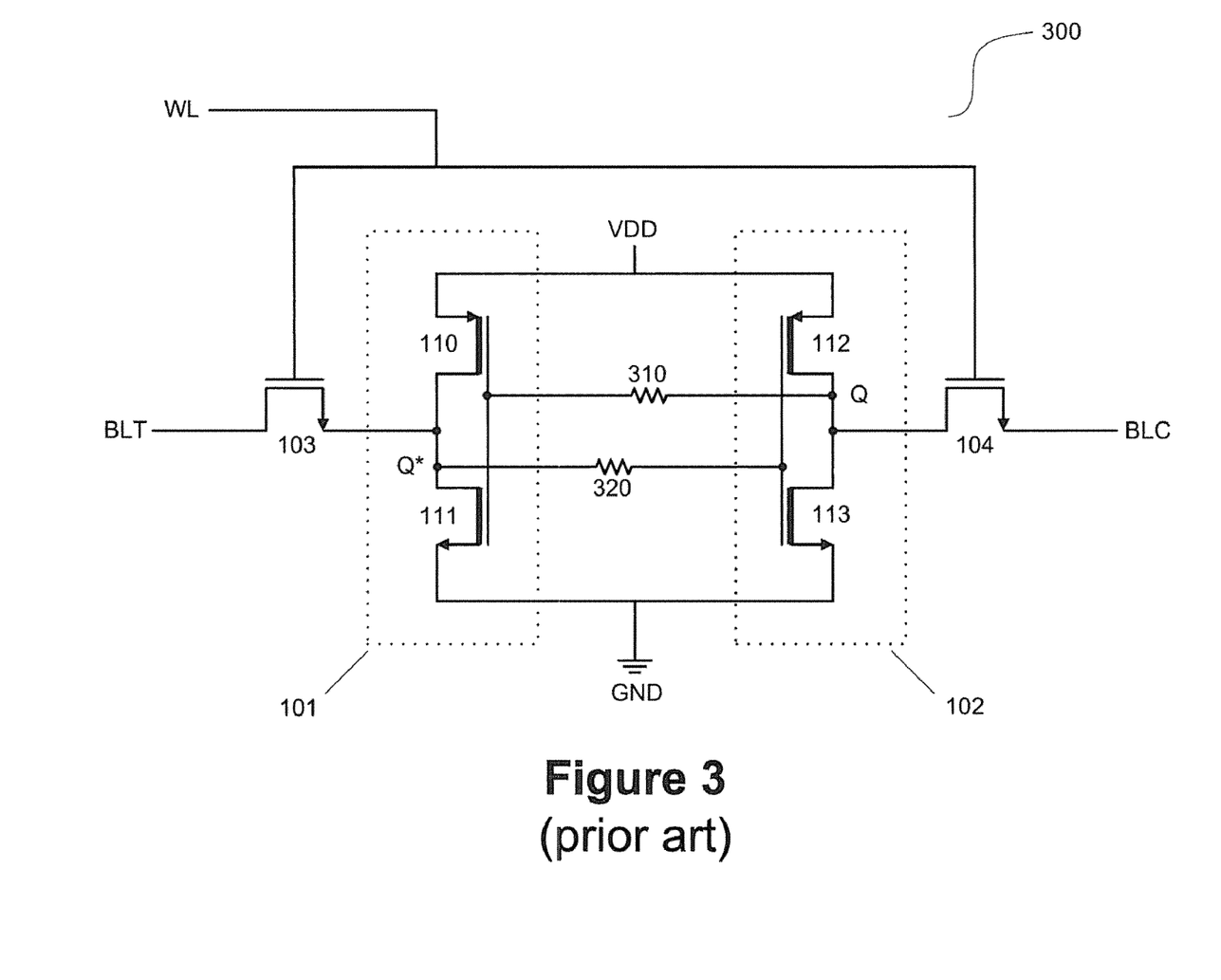
FIG. 3 shows a schematic drawing of a 6-transistor SRAM memory cell with cross-coupled resistors according to a known configuration.

FIG. 3 shows an SEU-resistant improvement to the design of the basic six-transistor SRAM memory cell 100 discussed above with respect to FIG. 1A. Cross-coupled resistors 310 and 320, often called feedback resistors, are respectively connected between output nodes Q and Qbar and the control nodes of inverters 101 and 102. This resistance operates to decrease the LET-sensitivity of memory cell 300. However, as silicon technology has scaled in line-width dimension into the deep sub-micron range (0.25 μm and smaller) process control in the manufacturing of these feedback resistors has increased in difficulty.

Figure 4:
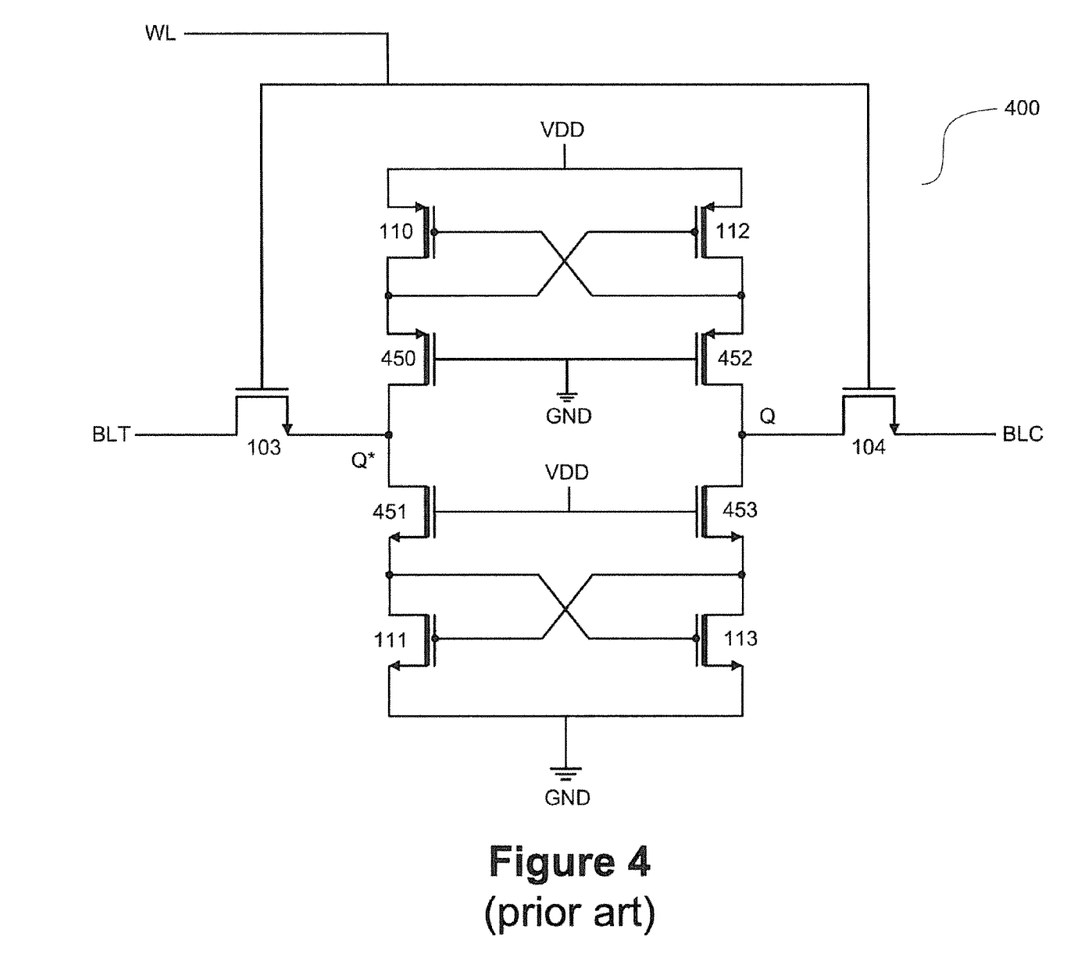
FIG. 4 shows a schematic diagram depicting a known configuration of an SRAM memory cell with 10 transistors.

FIG. 4 shows a known improved SRAM memory cell with a 10-transistor (10-T) configuration. This cell design uses secondary transistors, identified as P-fet (ohm) 450 and P-fet (ohm) 452 and N-fet (ohm) 451 and N-fet (ohm) 453 to provide ohmic channel resistance. P-fet 450 is inserted between pull-up P-fet 110 and output node Qbar; P-fet 452 is inserted between pull-up P-fet 112 and output node Q. Both P-fets 450 and 452 are gate-tied to GND such that they are powered in a permanent ON-state. Similarly, N-fet 451 is inserted between pull-down N-fet 111 and output node Qbar; N-fet 453 is inserted between pull-down N-fet 113 and output node Q. Both N-fets 451 and 453 are gate-tied to Vdd such that they, too, are powered in a permanent ON-state. The inline resistance of this configuration allows transistors 450-453 to operate as a voltage divider element to provide feedback resistance in the cell, much like resistors 310 and 320 operate with respect to memory cell 300 in FIG. 3. While improved, the design has a high LET sensitivity: the cell will upset with a heavy-ion LET as low as 9 (MeV cm2)/mg. The desired LET sensitivity would be above 40 (MeV cm2)/mg.

SUMMARY

A need still exists, therefore, for improved ways to decrease the low linear energy transfer (LET) sensitivity of unit memory cell used in static random access memory (SRAM) design. In particular, there is a need to decrease LET sensitivity where the application of the SRAM technology is intended for harsh radiation environments such as space or other high-radiation environments.

According to certain embodiments of the present invention, a circuit and method are provided in which a six-transistor (6-T) SRAM memory cell is hardened to single-event upsets by adding isolation-field effect transistors ("iso-fets") connected between the reference voltage Vdd and the field-effect transistors ("fets") respectively corresponding to first and second inverters of the memory cell. According to certain embodiments, the control gates of first and second P-iso-fets are respectively tied to the control gates of first and second pull-up P-fets. According to certain embodiments, first and second N-iso-fets are connected between the output nodes of the memory cell and the pull-down N-fets respectively corresponding to the first and second inverters. The control gates of the first and second N-iso-fets are respectively tied to the control gates of the first and second pull-down N-fets. Again according to certain embodiments, one or more of the iso-fets are physically removed from the proximity of other transistors which comprise the memory cell.

DETAILED DESCRIPTION

Figure 5:
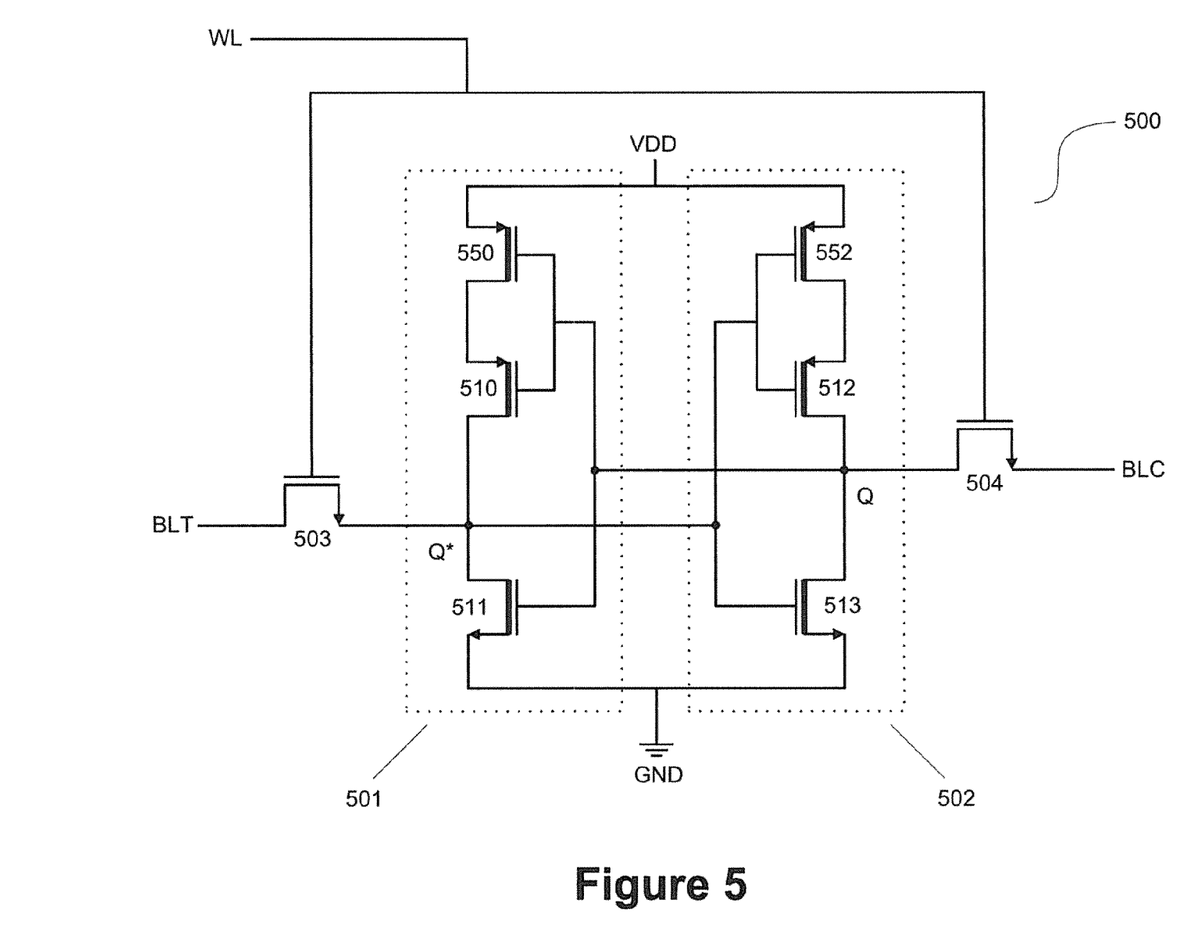
FIG. 5 shows a schematic diagram depicting an SRAM memory cell according to an embodiment of the present invention.

FIG. 5 shows an embodiment of the present invention wherein pull-up P-fets 510 and 512 have been isolated from reference voltage Vdd to prevent them from being in saturation mode when turned OFF. To accomplish this isolation, P-type isolation fets ("iso-fets") 550 and 552 have been inserted between Vdd and, respectively, pull-up P-fet 510 and pull-up P-fet 512. In this way, the P-iso-fets 550 and 552 eliminate or reduce the susceptibility of pull-up P-fets 510 and 512 to turning ON upon impact by various particles, such as high-energy heavy ions, that can cause single-event upsets, as will be described in more detail below.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well-known components and/or processes has not been shown or described in detail below to avoid unnecessarily obscuring the present invention.

To examine the operation of memory cell 500, again assume that the cell stores a logical 1 such that output node Q is at a high voltage (Vdd) while the complementary node Qbar is at a low voltage (ground). Because node Q is high, P-iso-fet 550 and P-fet 510 are both OFF and N-fet 511 is ON. Similarly, the low-logic state of Qbar keeps P-iso-fet 552 and P-fet 512 turned ON, leaving N-fet 513 off. Note that because P-iso-fet 550 is off, P-fet 510 is not in saturation mode (i.e., Vdd across the source and drain while the P-fet 510 is turned OFF).

Now imagine that a high-energy heavy ion impacts the memory cell 500. If the ion impacts P-iso-fet 550, the transistor may very well turn ON. This allows Vdd to charge the source node of pull-up P-fet 510, but does not result in turning ON pull-up P-fet 510—it merely places P-fet 510 in saturation mode temporarily. P-iso-fet 550 is in saturation mode, but cannot singlehandedly pull up output node Qbar if turned ON through the impact of such an ion. After P-iso-fet 550 recovers from the SEU impact, it returns to its OFF state and also allows P-fet 510 to be restored to non-saturation mode. If the heavy ion instead impacts pull-up P-fet 510 directly, then output node Qbar is again protected from erroneously turning ON. This is true because even if P-fet 510 turns ON in response to the impact of the heavy ion, the P-iso-fet 550 remains OFF and therefore provides no voltage the source node of pull-up P-fet 510. Thus, the P-fet 510 cannot turn ON from the impact of the heavy ion and thus a SEU of the memory cell 500 is prevented.

In the case in which memory cell 500 stores a logical 0, the output node Q is at approximately ground (i.e., a low-logic state) and complementary output node Qbar at approximately Vdd (i.e., a high-logic state). P-iso-fet 552 and pull-up P-fet 512 are both OFF, as is pull-down N-fet 511, but N-fet 511 is in saturation mode (i.e., Vdd across source and drain while turned OFF). P-iso-fet 552, by isolating P-fet 512 from reference voltage Vdd, prevents P-fet 512 from being in saturation mode by ensuring that its source node is isolated from Vdd. Thus if heavy ion or other particle impacts either P-iso-fet 552 or pull-up P-fet 512, it will not result in the erroneous charging of output node Q as analogously discussed above with respect to transistors 510 and 550 when memory cell 500 stores a logical 1.

The inclusion of pull-up transistors 510 and 512 may have a negative effect on the responsiveness of the memory cell 500, meaning the speed at which data may be written to the memory cell. This speed may be reduced in comparison to the SRAM memory cell 100 from FIG. 1, for example. However, memory cell 500 is advantageously hardened to SEU events through the inclusion of the P-iso-fets 550, 552. This is often more important than speed when contemplating memory cells operating in high radiation environments such as outer space.

Figure 6:
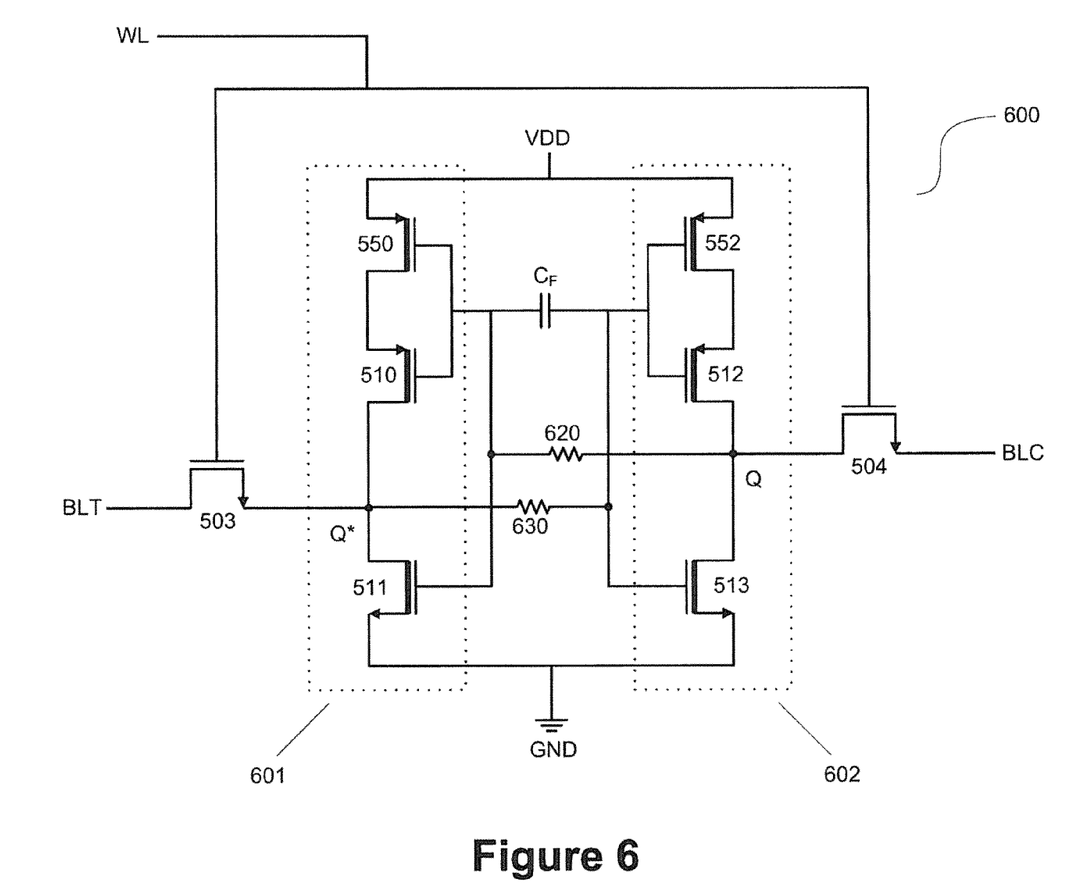
FIG. 6 shows a schematic diagram depicting an SRAM memory cell according to another embodiment of the present invention.

FIG. 6 shows an embodiment of the present invention in which resistive and capacitive elements have been added to the memory cell 500 of FIG. 5. Feedback resistor 620 is connected between the gates of inverter 601 and output node Q. Feedback resistor 630 is similarly connected between output node Qbar and the control gates of inverter 602. Capacitor $C_F$ is connected between the control gates of inverters 601 and 602. A capacitor (not shown) may also be connected between GND and the control gates of inverter 601, and/or a capacitor (not shown) connected between GND and the control gates of inverter 602. Each of these elements slows the write-time and lengthens the cell recovery time. As discussed above, by slowing the write-time for the memory cell or otherwise lengthening its recovery time, the chances that an SEU impact will flip the state of the memory cell is reduced. One skilled in the art will understand that many combinations of these elements may be used, including each alone.

Figure 7:
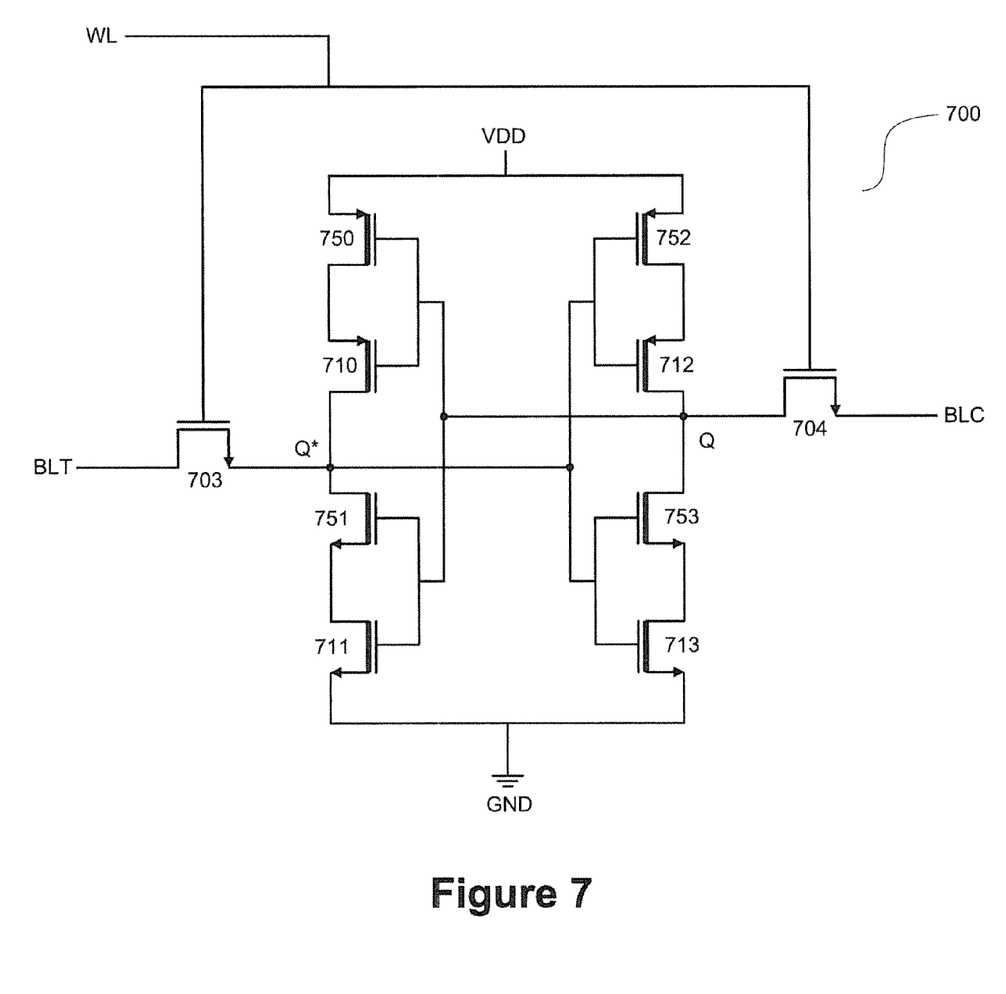
FIG. 7 shows a schematic diagram depicting an SRAM memory cell according to still another embodiment of the present invention.

FIG. 7 schematically depicts an SRAM memory cell 700 in accordance with another embodiment. Similar to P-iso-fets 550 and 552 discussed above while discussing FIG. 5, P-iso-fets 750 and 752 are in place between Vdd and pull-up P-fet transistors 710 and 712 respectively, isolating them from reference voltage Vdd and preventing them from existing in saturation mode while OFF. In addition, an N-iso-fet transistor 751 is placed between output node Qbar and pull-down N-fet transistor 711 and prevents N-fet 711 from being in saturation mode while OFF. Similarly, an N-iso-fet transistor 753 is placed between output node Q and pull-down N-fet transistor 713 and prevents N-fet 713 from being in saturation mode while OFF.

In operation, the pull-up portion of memory cell 700 operates identically to that of memory cell 500 in FIG. 5. However, the pull-down portion is now afforded similar protection from SEUs. Assuming that memory cell 700 stores a logical 1, output node Q is charged to approximately Vdd (i.e., a voltage corresponding to a high-logic state) and complementary output node Qbar is at approximately ground (i.e., a voltage corresponding to a low-logic state). Consequently, both P-iso-fet 750 and pull-up P-fet 710 are off, as are N-iso-fet 753 and pull-down N-fet 713. Because of the isolation from Vdd or output node Q provided by, respectively, P-iso-fet 750 and N-iso-fet 753, neither pull-up transistor 710 nor pull-down transistor 713 are in saturation mode.

In this situation, if heavy ion or other particle impacts N-iso-fet transistor 753 with sufficient energy, the extra charge creation can turn the transistor 7530N. As analogously discussed above with respect to isolation transistors 550 and 552 of FIG. 5, however, this will not erroneously change the state of output node Q and therefore the value stored in memory cell 700 remains unchanged. Instead, this situation will simply charge the source node of N-fet 713 responsive to the transistor 752 turning ON, with the voltage on the source node of N-fet 713 simply allowing that transistor to reach saturation mode temporarily. If, on the other hand, a heavy ion or other particle impacts pull-down N-fet transistor 713 directly, this transistor will not turn ON because it was not in saturation mode to begin with. Instead, the excess charge created by the SEU will simply recombine over the recovery time of the cell.

As discussed above with respect to memory cell 600 and FIG. 6, it is possible to add additional circuit elements in order to slow the cell write-time and lengthen the cell recovery time. For example, the resistors 620 and 630 may be similarly connected within the memory cell 700, respectively between the gates of inverters 701 and 702 and output nodes Q and Qbar. The capacitor configurations described above with respect to memory cell 600 are also usable within the embodiment depicted in FIG. 7. Again, one skilled in the art will understand that many combinations of these elements may be used, including each alone.

Figure 8A:
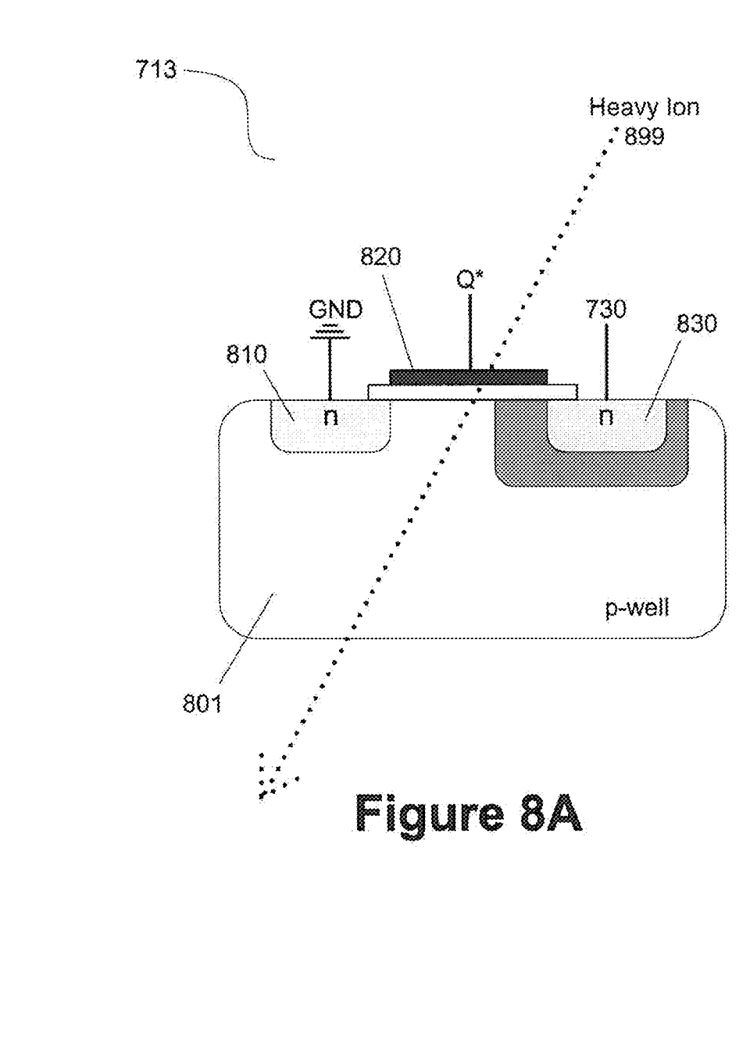
FIGS. 8A-8B depict respective cross-sectional views of a transistor in accordance with certain embodiments of the present invention.
Figure 8B:
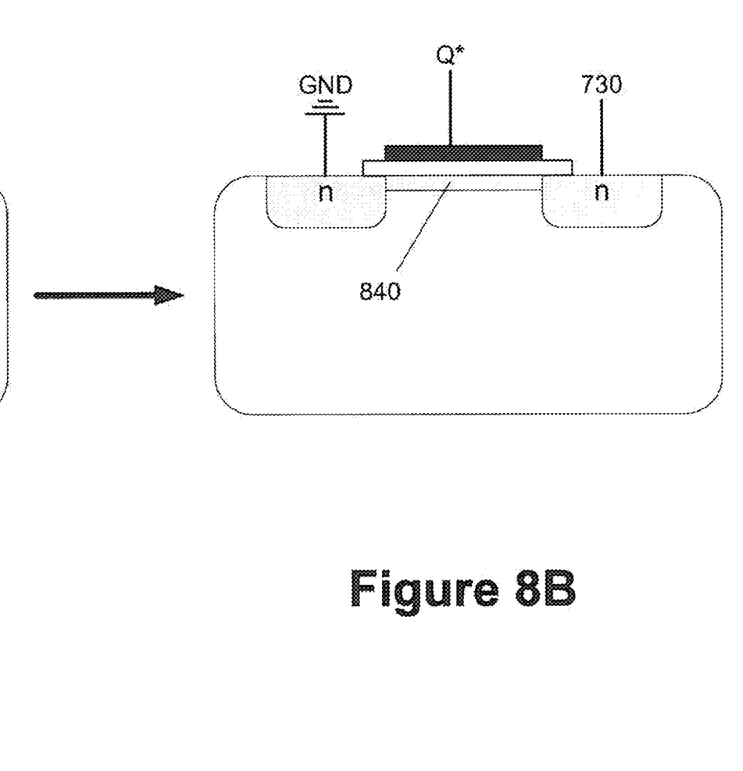

FIG. 8A depicts a cross-section of pull-down N-fet transistor 713 from FIG. 7 and illustrates the operation of the N-iso-fet in preventing the N-fet transistor 713 from turning ON in response to the impact of a high energy ion. Assume memory cell 700 stores a logical 1 and transistor 713 is impacted by a heavy ion 899. Here, similar to the scenario discussed above with respect to FIG. 2A, excess charge creation is transferred to the portion of substrate 801 between source node 810 and drain node 830. However, because of the isolation from output node Q (FIG. 7) provided by N-iso-fet 753 (FIG. 7), the drain is not tied directly to output node Q but rather to isolated node 730. As such, there is very little difference in potential between source 810 and drain 830 (i.e., approximately Vdd is not applied across source and drain), and the excess charge deposition caused by the impact of heavy ion 899 is insufficient to turn ON the transistor 713. FIG. 8B shows the resulting charge accumulation in channel region 840, which quickly recombines without turning ON transistor 713.

The described operation of the embodiments depicted in FIGS. 5-7 has assumed that a given SEU event strikes an iso-fet or its corresponding pull-up or pull-down transistor, but not both. Unfortunately, this need not always be the case. Due to the size of some heavy ion particles and the dimensions of SRAM cells in modern manufacturing, it is possible for a single SEU event (i.e., high energy ion) to impact multiple adjacent transistors. Such a multiple-transistor impact could result in a soft error despite the existence of the iso-fets. For example, if the memory cell 700 stores a logic 1 (i.e., node Q is high and node Qbar is low) and both N-iso-fet 753 and N-fet 713 are impacted by a high energy ion, both transistors 753 and 713 could turn ON, driving the node Q low and flipping the state of the cell (i.e., node Q low and node Qbar high).

Figure 9:
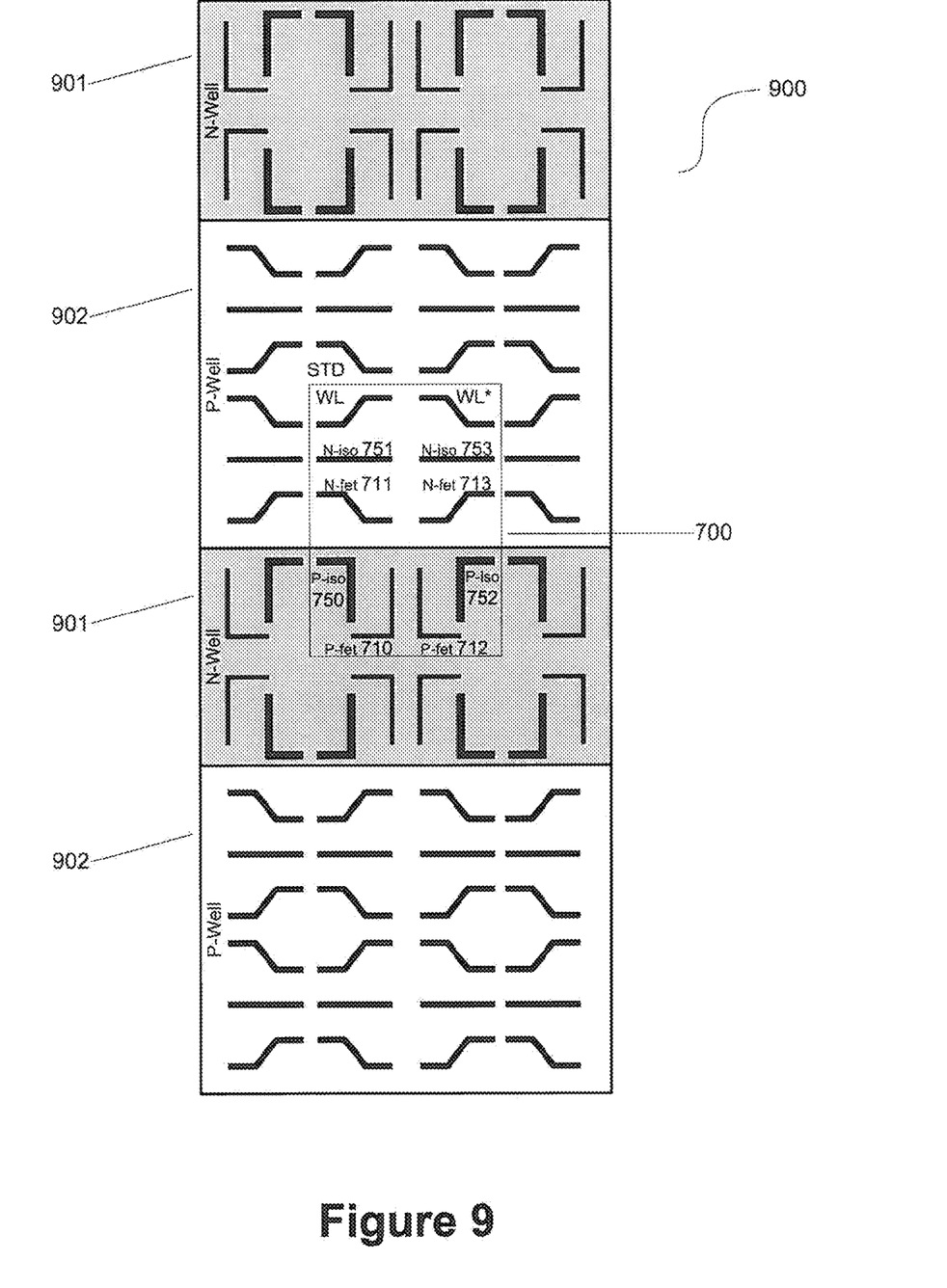
FIG. 9 shows a top-view of the physical layout of the memory cell of FIG. 7 according to one embodiment of the present invention.

FIG. 9 shows a top-view of the physical layout of the SRAM cell 700 according to one embodiment of the present invention. The memory cell 700 is disposed in a substrate 900 with alternating N-well sections 901 and P-well sections 902. N-iso-fet transistor 751 is formed adjacent to its corresponding pull-down N-fet transistor 711, and N-iso-fet 753 is formed similarly adjacent to its corresponding N-fet transistor 713. Likewise, P-iso-fet transistor 750 is formed adjacent to its corresponding pull-up P-fet transistor 710, and P-iso-fet 752 and P-fet 712 are also formed adjacently in substrate 900. Because of this physical proximity, these pairs are susceptible to the scenario described above with respect to a multiple-transistor impact of a large heavy-ion.

To examine this eventuality, again assume that memory cell 700 stores a logical 1. Output node Q is in its high-logic state; complementary output node Qbar is in its low-logic state; and both N-iso-fet transistor 753 and corresponding pull-down N-fet transistor 713 are off (non-conducting). Now assume that a large heavy ion strikes the memory cell 700 in an area large enough to encompass both adjacent transistors 713 and 753. N-iso-fet 753 is already in saturation mode, so the impact turns the transistor 7530N as discussed earlier. Pull-down N-fet transistor 713 is OFF, and ordinarily the impact of the SEU would only result in a brief excess charge deposition in the channel region of the transistor 713, insufficient to turn it ON. However, because the SEU impact also turns ON N-iso-fet 753, isolation node 730 is charged and so is the source node of N-fet transistor 713—placing N-fet 713 in saturation mode. If the turning ON of N-iso-fet 753 and subsequent charging of isolation node 730 coincides with the excess charge deposition in the channel region of N-fet 713, then output node Q may very well be pulled down and the state of memory cell 700 flipped, causing a soft error.

Figure 10:
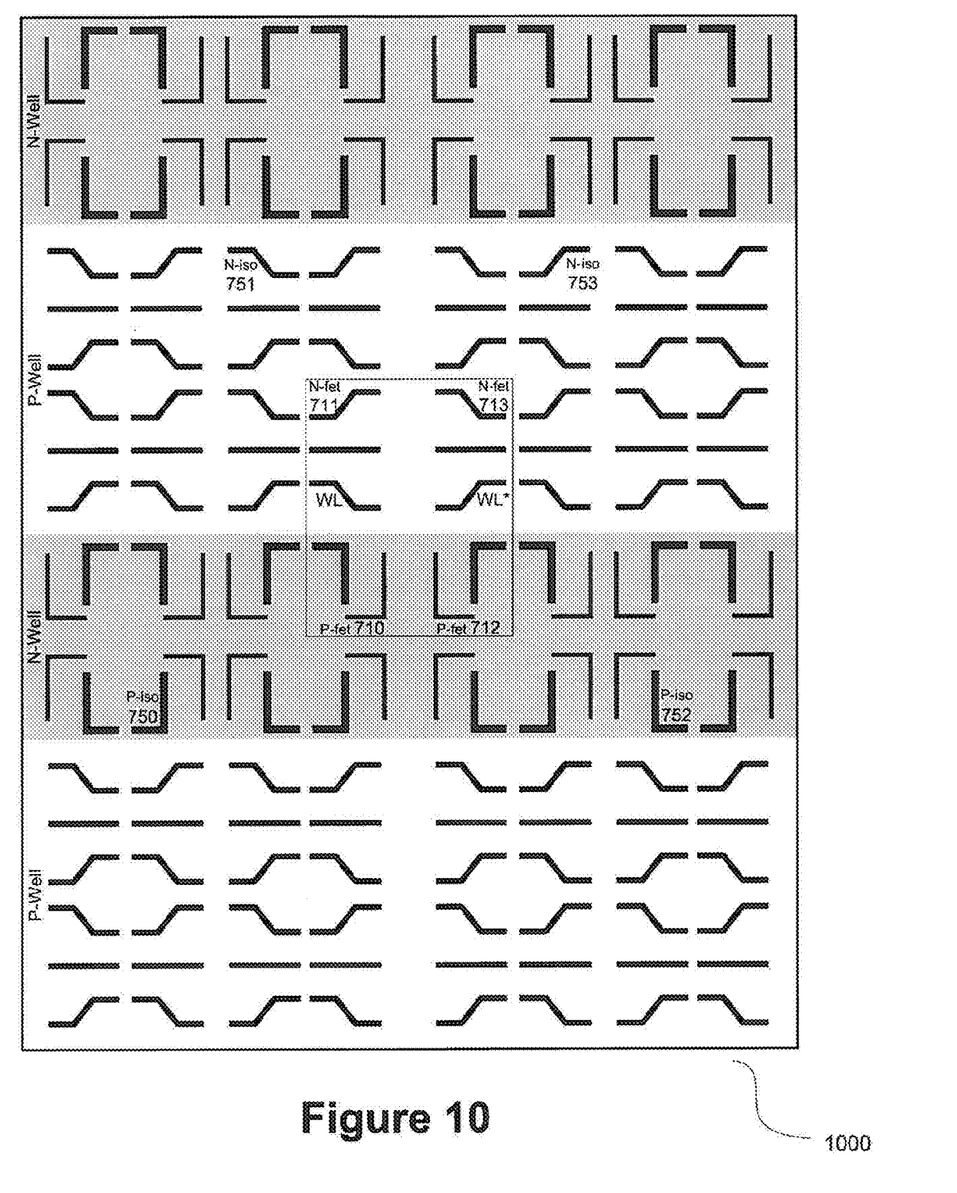
FIG. 10 shows a top-view of the physical layout of the memory cell of FIG. 7 according to another embodiment of the present invention.

Advantageously, certain embodiments of the present invention reduce the likelihood of this eventuality by physically separating the iso-fets from their corresponding pull-up or pull-down transistors. FIG. 10 shows a top-view of the physical layout of the SRAM memory cell 700 (FIG. 7) according to another embodiment of the present invention. Memory cell 700 is disposed in a substrate 1000. The iso-fet transistors 750-751 and 752-753 are placed at a significant distance from their respective pull-up and pull-down transistors 710-713. A P-iso-fet may be disposed in the same N-well as its corresponding P-fet, or another N-well altogether. Similarly, an N-iso-fet and its corresponding N-fet transistor may share a P-well or be disposed in different P-wells. In this way, the components of the given memory 700 are interleaved with the components of other memory cells to provide physical separation between isolation transistors and the associated pull-up or pull-down transistors to which these isolation transistors are electrically connected. Due to this interleaving, the impact of a heavy ion at the physical location of the one of these transistors does not affect the other one of the transistors so that at least one of the transistors remains OFF and prevents and SEU event from occurring. Test results indicate that in certain embodiments, a distance of 2 μm to 5 μm between an iso-fet and its corresponding pull-up or pull-down transistor may be most effective. The likelihood of an SEU impact disturbing both transistors when they are so separated is advantageously reduced. In certain embodiments, multiple interleaved memory cells are disposed in a substrate such that a given radius may circumscribe the pull-up and pull-down transistors from one memory cell and one or more iso-fet transistors from a plurality of other memory cells.

Figure 11:
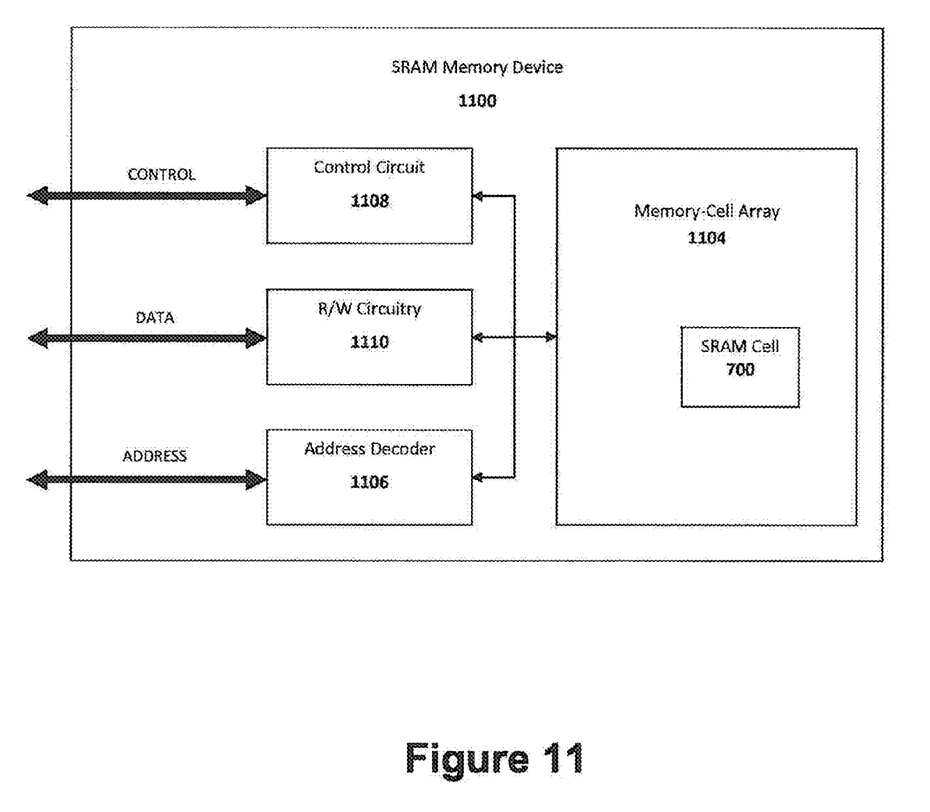
FIG. 11 is a block diagram of an SRAM memory device in accordance with certain embodiments of the present invention.

FIG. 11 is a block diagram of an SRAM memory device which includes the SRAM memory cell 700 of FIG. 7. The memory device 1100 further includes an address decoder 1106, a control circuit 1108, and read/write circuitry 1110, all of which are conventional and known in the art. The address decoder 1106, control circuit 1108, and read/write circuitry 1110 are all coupled to the memory-cell array 1104. In addition, the address decoder 1106 is coupled to an address bus, the control circuit 1108 is coupled to a control bus, and the read/write circuitry 1110 is coupled to a data bus. The operation of the components 1100-1110 and overall operation of the memory device 1100 is the same as a conventional memory device during normal operating condition, and thus, for the sake of brevity will not be described in more detail herein. The SRAM cells 700 operate as previously discussed in the event of being impacted by radiation to prevent SEUs.

Figure 12:
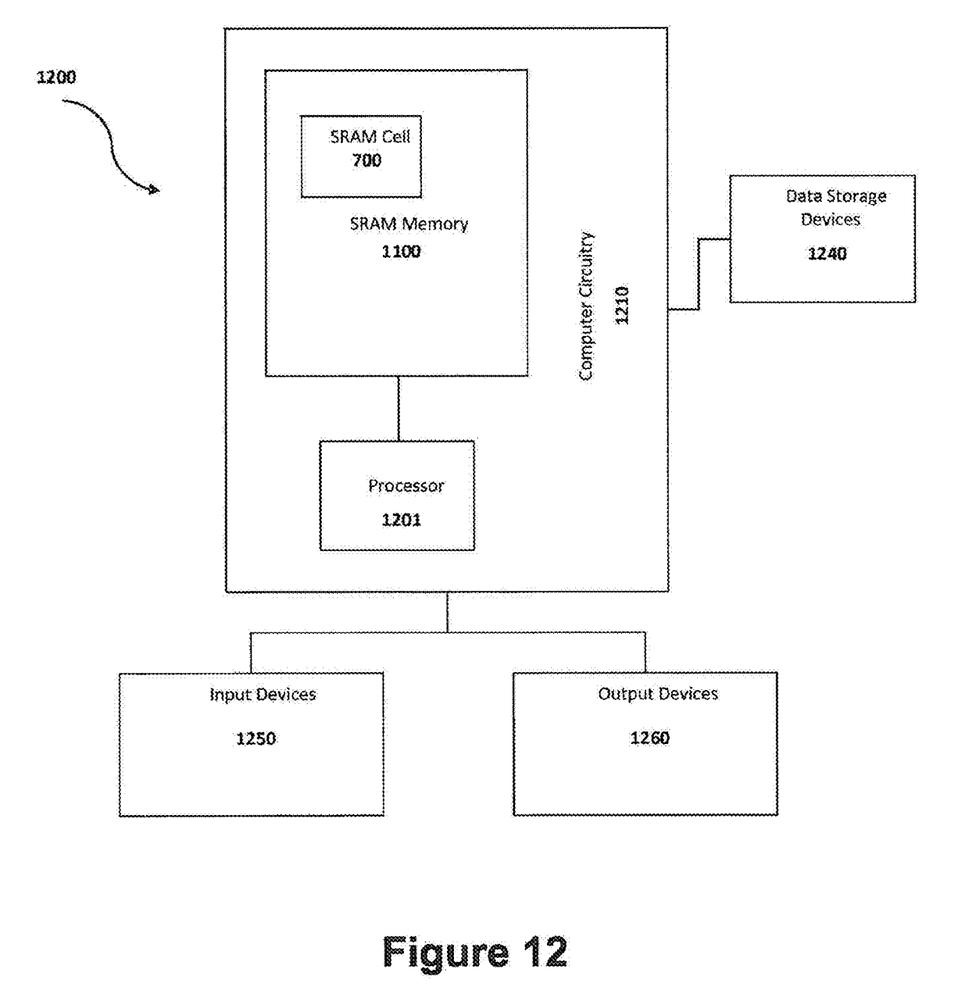
FIG. 12 is a block diagram of an electronic system comprising an SRAM memory device in accordance with certain embodiment of the present invention.

FIG. 12 is a block diagram of a computer system 1200 including computer circuitry 1210 and the SRAM memory device 1100 of FIG. 11. Typically, the computer circuitry 1210 and memory 1100 are coupled to a processor 1201. Also typically, the computer circuitry 1210 is coupled through address, data, and control buses to the memory device 1100 to provide for writing data to and reading data from the memory device. The computer circuitry 1210 includes circuitry for performing various computing functions, such as executing specific software to perform specific calculations or tasks. In addition, the computer system 1200 includes one or more input devices 1250, such as a keyboard or a mouse, coupled to the computer circuitry 1210 to allow an operator to interface with the computer system. Typically, the computer system 1200 also includes one or more output devices 1260 coupled to the computer circuitry 1210, such output devices typically including a printer and a video terminal. One or more data storage devices 1240 are also typically coupled to the computer circuitry 1210 to store data or retrieve data from external storage media (not shown). Examples of typical storage devices 1240 include hard and floppy disks, tape cassettes, compact disc read-only (CD-ROMs) and compact disc read-write (CD-RW) memories, and digital video discs (DVDs).

It is to be understood that even though various embodiments and advantages of the present invention have been set forth in the foregoing description, the above disclosure is illustrative only, and changes may be made in detail, and yet remain within the broad principles of the invention. For example, components described above may be implemented using technologies other than MOS technology, such as bipolar or gallium arsenide technologies. Therefore, the present invention is to be limited only by the appended claims.

What is claimed is:

1. A memory cell disposed in a substrate, comprising:
   first and second output nodes;
   a first P-type transistor having a first conduction node connected to a first reference voltage, a control node connected to said first output node, and a second conduction node connected to said second output node;
   a second P-type transistor having a first conduction node connected to said first reference voltage, a control node connected to said second output node, and a second conduction node connected to said first output node;
   first and second N-type transistors connected in series between the first output node and a second reference voltage, each of said first and second N-type transistors having a respective control node connected to said second output node;
   third and fourth N-type transistors connected in series between the second output node and said second reference voltage, each of said third and fourth N-type transistors having a respective control node connected to said first output node, wherein said first and third N-type transistors are physically formed at least two microns distant from each of said first and second P-type transistors and said second and fourth N-type transistors; and
   a first capacitive element coupled between said second reference voltage and the control nodes of at least the first, second and third N-type transistors.

2. The memory cell of claim 1, further comprising a second capacitive element coupled between said second reference voltage and the control nodes of at least the first and second P-type field transistors.

* * * * *